United States Patent
May et al.

(10) Patent No.: US 10,573,622 B2
(45) Date of Patent: Feb. 25, 2020

(54) METHODS OF FORMING JOINT STRUCTURES FOR SURFACE MOUNT PACKAGES

(71) Applicant: Intel Corporation, Santa Clara, CA (US)

(72) Inventors: Lilia May, Chandler, AZ (US); Edward R. Prack, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 98 days.

(21) Appl. No.: 15/720,480

(22) Filed: Sep. 29, 2017

(65) Prior Publication Data

US 2019/0103377 A1 Apr. 4, 2019

(51) Int. Cl.
| | |
|---|---|
| *H01L 23/00* | (2006.01) |
| *H01L 21/48* | (2006.01) |
| *H01L 21/50* | (2006.01) |
| *H01L 23/538* | (2006.01) |
| *H01L 23/31* | (2006.01) |
| *H01L 25/10* | (2006.01) |
| *H01L 21/60* | (2006.01) |

(52) U.S. Cl.
CPC .......... *H01L 24/82* (2013.01); *H01L 21/4864* (2013.01); *H01L 21/50* (2013.01); *H01L 23/3128* (2013.01); *H01L 23/5384* (2013.01); *H01L 24/28* (2013.01); *H01L 24/31* (2013.01); *H01L 25/105* (2013.01); *H01L 24/16* (2013.01); *H01L 24/48* (2013.01); *H01L 24/81* (2013.01); *H01L 2021/60052* (2013.01); *H01L 2021/60097* (2013.01); *H01L 2224/16225* (2013.01); *H01L 2224/48227* (2013.01); *H01L 2224/81815* (2013.01); *H01L 2224/821* (2013.01); *H01L 2224/822* (2013.01); *H01L 2924/00014* (2013.01); *H01L 2924/14* (2013.01); *H01L 2924/1433* (2013.01); *H01L 2924/15311* (2013.01); *H01L 2924/15331* (2013.01); *H01L 2924/181* (2013.01); *H01L 2924/1815* (2013.01)

(58) Field of Classification Search
CPC ......... H01L 24/28; H01L 24/31; H01L 24/82; H01L 25/117; H01L 24/95; H01L 24/81; H01L 25/11; H01L 24/17; H01L 25/0657; H01L 25/50
See application file for complete search history.

(56) References Cited

U.S. PATENT DOCUMENTS

| | | | | |
|---|---|---|---|---|
| 5,064,481 | A * | 11/1991 | Davis ..................... | B23K 35/36 148/23 |
| 2015/0255415 | A1* | 9/2015 | De Bonis ............ | H01L 25/0657 438/126 |

* cited by examiner

*Primary Examiner* — Ermias T Woldegeorgis
(74) *Attorney, Agent, or Firm* — Green, Howard & Mughal LLP

(57) ABSTRACT

Methods/structures of joining package structures are described. Those methods/structures may include forming a metal formate on a surface of a first solder interconnect structure disposed on a first package substrate at a first temperature, and attaching a second solder interconnect structure disposed on a second package substrate to the first solder interconnect structure at a second temperature. The second temperature decomposes at least a portion of the metal formate and generates a hydrogen gas. The generated hydrogen gas removes an oxide from the second solder interconnect structure during joint formation at the second temperature.

8 Claims, 5 Drawing Sheets

METHODS OF FORMING JOINT STRUCTURES FOR SURFACE MOUNT PACKAGES

BACKGROUND

The assembly processes utilized in the assembly of microelectronic package structures, such as package on package (PoP), various ball grid array (BGA) structures, and/or even die attach processes, for example, can be a fabrication challenge for electronic manufacturers. Surface mount technologies (SMT) that may be used to assemble PoP package structures may suffer yield loss due to solder joint opens and solder bridging failure mechanisms, particularly when packaged die/devices undergo reflow process during SMT assembly and/or any other attachment processes, such as thermal compression bonding, for example.

BRIEF DESCRIPTION OF THE DRAWINGS

While the specification concludes with claims particularly pointing out and distinctly claiming certain embodiments, the advantages of these embodiments can be more readily ascertained from the following description when read in conjunction with the accompanying drawings in which:

DETAILED DESCRIPTION

Figure 1A:
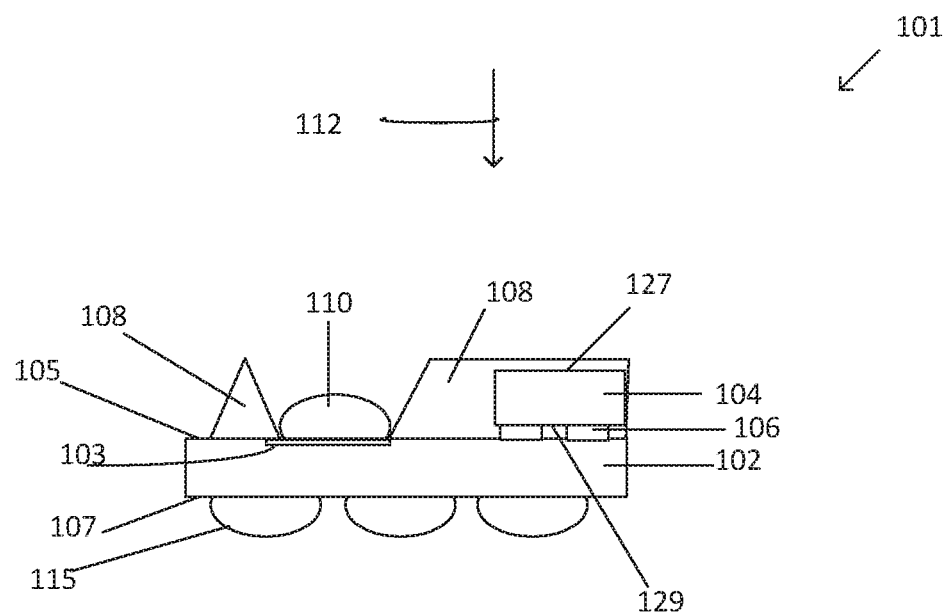
FIGS. 1a-1e represent cross-sectional views of structures according to embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments.

The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views. The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Layers and/or structures "adjacent" to one another may or may not have intervening structures/layers between them. A layer(s)/structure(s) that is/are directly on/directly in contact with another layer(s)/structure(s) may have no intervening layer(s)/structure(s) between them.

Various implementations of the embodiments herein may be formed or carried out on a substrate, such as a package substrate. A package substrate may comprise any suitable type of substrate capable of providing electrical communications between a die, such as an integrated circuit (IC) die, and a next-level component to which an microelectronic package may be coupled (e.g., a circuit board). In another embodiment, the substrate may comprise any suitable type of substrate capable of providing electrical communication between an IC die and an upper IC package coupled with a lower IC/die package, and in a further embodiment a substrate may comprise any suitable type of substrate capable of providing electrical communication between an upper IC package and a next-level component to which an IC package is coupled.

A substrate may also provide structural support for a die/device. By way of example, in one embodiment, a substrate may comprise a multi-layer substrate—including alternating layers of a dielectric material and metal—built-up around a core layer (either a dielectric or a metal core). In another embodiment, a substrate may comprise a coreless multi-layer substrate. Other types of substrates and substrate materials may also find use with the disclosed embodiments (e.g., ceramics, sapphire, glass, etc.). Further, according to one embodiment, a substrate may comprise alternating layers of dielectric material and metal that are built-up over a die itself—this process is sometimes referred to as a "bumpless build-up process." Where such an approach is utilized, conductive interconnects may or may not be needed (as the build-up layers may be disposed directly over a die, in some cases).

A die/device may comprise any type of integrated circuit device. In one embodiment, the die may include a processing system (either single core or multi-core). For example, the die may comprise a microprocessor, a graphics processor, a signal processor, a network processor, a chipset, etc. In one embodiment, a die may comprise a system-on-chip (SoC) having multiple functional units (e.g., one or more processing units, one or more graphics units, one or more communications units, one or more signal processing units, one or more security units, etc.). However, it should be understood that the disclosed embodiments are not limited to any particular type or class of devices/die.

Conductive interconnect structures may be disposed on a side(s) of a die/device, and may comprise any type of structure and materials capable of providing electrical communication between a die/device and a substrate, or another die/device, for example. In an embodiment, conductive interconnect structures may comprise an electrically conductive terminal on a die (e.g., a pad, bump, stud bump, column, pillar, or other suitable structure or combination of structures) and a corresponding electrically conductive terminal on a substrate (e.g., a pad, bump, stud bump, column, pillar, or other suitable structure or combination of structures). Solder (e.g., in the form of balls or bumps) may be disposed on the terminals of the substrate and/or die/device, and these terminals may then be joined using a solder reflow process. Of course, it should be understood that many other types of interconnects and materials are possible (e.g., wirebonds extending between a die and a substrate and/or copper/other metal/metal alloy pads/pillars).

The terminals on a die may comprise any suitable material or any suitable combination of materials, whether disposed in multiple layers or combined to form one or more alloys and/or one or more intermetallic compounds. For example, the terminals on a die may include copper, aluminum, gold, silver, nickel, titanium, tungsten, as well as any combination of these and/or other metals. In other embodiments, a terminal may comprise one or more non-metallic materials (e.g., a conductive polymer). The terminals on a substrate may also comprise any suitable material or any suitable combination of materials, whether disposed in multiple layers or combined to form one or more alloys and/or one or more intermetallic compounds. For example, the terminals on a substrate may include copper, aluminum, gold, silver, nickel, titanium, tungsten, as well as any combination of these and/or other metals. Any suitable solder material may be used to join the mating terminals of the die and substrate, respectively. For example, the solder material may comprise any one or more of tin, copper, silver, gold, lead, nickel, indium, as well as any combination of these and/or other metals. The solder may also include one or more additives and/or filler materials to alter a characteristic of the solder (e.g., to alter a reflow temperature and/or to modify thermomechanical properties of a joint).

Embodiments of methods of forming packaging structures, such as methods of forming a metal formate coating on solder balls and/or metal pads/wires/pins/pillars to facilitate the reliability of solder mounting processes, for example, are described. Those methods/structures may include forming a metal formate coating on a surface of a first solder ball, wherein the first solder ball is disposed on a first package substrate, and wherein the first solder ball is adjacent a die on a first surface of the first package substrate. The first package substrate may be attached to a second package substrate by using an attachment process, wherein a second solder ball is disposed on a surface of the second substrate, and wherein the attachment process produces hydrogen gas and carbon dioxide.

A solder joint may be formed by joining the first and second solder balls. The hydrogen gas produced by at least a partial decomposition of the metal formate during the attachment process removes metal oxide from the second solder ball (producing water), thus improving the joint quality and reliability. The embodiments herein enable the formation of solder joints which avoid solder bridging (since metal formate coating provides enough oxide cleaning capacity so that the use of conventional soldering fluxes and solder pastes is eliminated or reduced) and solder opens during attachment processes, such as surface mount technologies (SMT) used in package on package assemblies, for example.

FIGS. 1a-e illustrate side cross-sectional views of embodiments of fabricating package structures comprising a formate based coating for solder balls, such as through mold interconnect (TMI) solder spheres, that may be utilized during attachment processes, such as SMT assembly processing. In FIG. 1a (cross-sectional view), a portion of package structure 101, which may comprise a lower portion/package of a package on package (PoP) assembly, may include a substrate 102. The substrate 102 may comprise a system on chip substrate, in an embodiment and may comprise a first side 105 and a second side 107. A die 104, may be disposed on the first side 105 of the substrate 102, and may be physically and electrically coupled to the first side 105 of the substrate 102 by a plurality of conductive interconnect structures 106. The die 104 includes a first side 129 and an opposing back side 127. In some embodiments, the first side 129 may be referred to as the "active surface" of the die.

A number of interconnects 106 extend from the die's first side 129 to the underlying substrate 102, and these interconnects 106 electrically couple the die 104 and the substrate 102. Interconnects 106 may comprise any type of structure and materials capable of providing electrical communication between the die 104 and the substrate 102, and according to one embodiment, as illustrated in FIG. 1a, the die 104 is disposed on the substrate 102 in a flip-chip arrangement. Solder (e.g., in the form of balls or bumps) may be disposed on the terminals 106 of the substrate 102 and/or die 104, and these terminals may then be joined using one of many available solder reflow process technologies. Of course, it should be understood that many other types of interconnects and materials are possible (e.g., wirebonds extending between the die 104 and substrate 102).

At least one through mold interconnect (TMI) solder ball/interconnect structure 110 may be disposed on a conductive pad/terminal 103 disposed on/within the first side 105 of the substrate 102. The TMI solder ball(s) 110 may be disposed on a peripheral portion of the substrate 102, in an embodiment, and may be disposed adjacent sidewalls of a mold compound 108. In an embodiment, there may be two or more TMI solder balls 110 adjacent each other (not shown) in the periphery region of the substrate 102. The die 104 may be embedded at least partially within the mold compound 108, and the TMI solder ball 110 may be disposed adjacent the die 104 on the first side of the substrate 102, and may be disposed within an opening of the molding compound 108, in an embodiment. The pad 103 may comprise a conductive material, and may be physically and electrically coupled by routing lines/traces (not shown) through the substrate 102 to at least one substrate solder ball 115 that is disposed on a second side 107 of the substrate 102. The substrate solder ball(s) 115 may comprise at least one second level interconnect (SLI) structure, in an embodiment.

A formate process 112 may be applied to the package structure 101, wherein a formic acid vapor may be applied to react with the TMI solder ball(s) 110 and/or with the substrate solder balls 115. In another embodiment, the formate process may be applied to solder balls disposed on an upper package of a POP assembly as well, to be described subsequently herein. The formate process 112 may be performed between about 150 degrees Celsius and about 200 degrees Celsius, in an embodiment. In an embodiment, the formate process 112 may comprise applying a formic acid vapor concentration of at least about 0.4% to the package structure 101, which serves to initiate a metal formate coating/layer on surfaces of the TMI solder balls 110 and/or on surfaces of the substrate solder balls 115. The formic acid reacts with a metal oxide or metals oxides on a surface/within the TMI solder ball(s) 110 and/or substrate solder balls 115, to form the metal formate coating/layer 114.

In another embodiment, the formic acid vapor concentration may comprise greater than about 1.5%, to form the metal-formate coating 114 on the TMI solder balls 110 and/or on the substrate solder ball(s) 115. In an embodiment, metal formate (ME(COOH)$_2$) may comprise any suitable metal constituent, such as copper or tin, of the solder balls disposed within a POP package, such as the substrate solder balls 115, the TMI solder balls, and/or upper level package structure solder balls. The metal formate may form on solder ball surfaces in a super saturated formic acid environment.

The formic acid metal oxide reduction reaction may be expressed as follows: When the formate process 112 temperature is greater than about 150 degrees Celsius, but less than about 200 degrees Celsius, formic acid (HCOOH) is reacted with metal oxide (MeO) present on the surface of the solder balls 110, 115, to form metal formate, Me(COOH)$_2$, on the surface of the solder balls 110, 115.

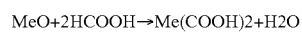

$$MeO + 2HCOOH \rightarrow Me(COOH)_2 + H_2O$$

The metal formate may be detected by using spectographic and/or microscopic analysis, since the physical and/or chemical structure of the solder balls 110, 115 surface is altered by the formate process 112. When the formate process temperature is greater than about 200 degrees Celsius, the metal formate that is formed/disposed on the solder ball 110, 115 surfaces may be reduced, and at least partially removed from the solder ball surfaces, which releases CO2 and H2 gases:

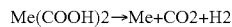

Figure 1B:
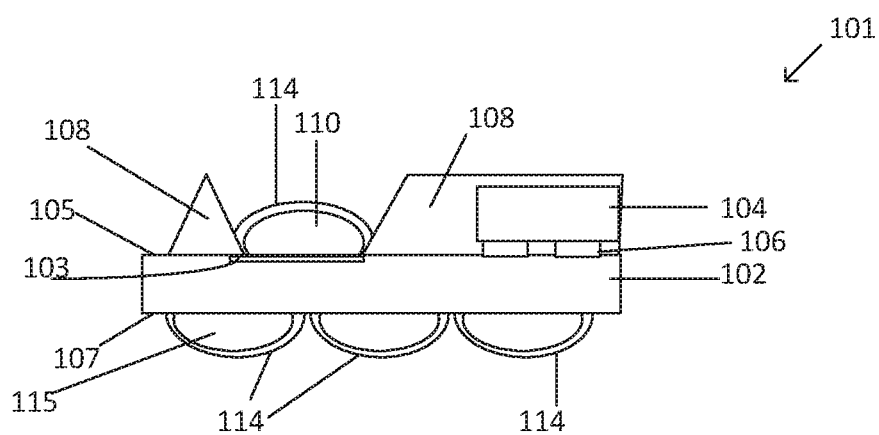

FIG. 1b (cross-sectional view) depicts the metal formate 114 disposed at least partially, on the surface of the TMI solder ball 110, and disposed at least partially, on the surface of the substrate solder ball 115, subsequent to being exposed to the formate process 112 at a temperature of between about 150 to about 200 degrees Celsius. The metal formate coating/layer 114 may comprise a thickness of about a monolayer to about 1 micrometer. By orienting the package structure 101 within a vapor reflow tool during the formate process 112, it is possible to form the metal formate 114 on either the TMI solder ball 110 and/or the substrate solder ball 115.

Figure 1C:
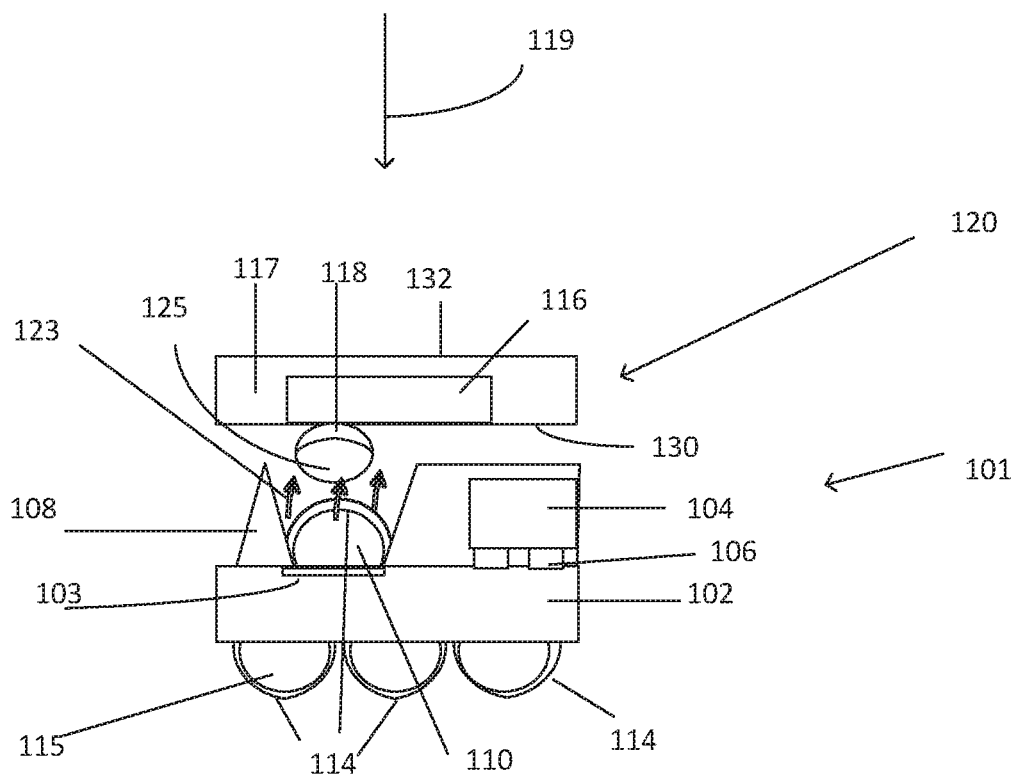

In FIG. 1c depicts a portion of (cross-sectional view), an upper level package structure 120, which may comprise an upper package 120 of a PoP assembly, that may include a die 116, such as a memory die, for example, attached/disposed on a first side 130 of a second substrate 117. The second substrate 117 may comprise a second side 132 opposite the first side 130. The first side 130 of the second substrate 117 may include at least one solder ball 118 located near a periphery of the second substrate 117. The at least one solder ball 118 may comprise a layer of metal oxide 125 on a surface of the at least one solder ball 118. In an embodiment, the upper level package structure 120 may be exposed to a formate process (such as the formate process 112 of FIG. 1a) prior to a solder reflow process. A metal formate coating may optionally be formed on the at least one solder ball 118.

The upper package 120 and the lower package 101 may be exposed to an attachment process 119, wherein the upper and lower packages may be physically coupled to each other. In an embodiment, the attachment process 119 may comprise a surface mount process 119, and may be performed at a temperature of between about 200 degrees Celsius and greater than 240 degrees Celsius (depending on melting temperature of solder ball metal/alloy). The temperature of the attachment process may vary according to the particular application, but may be performed at a melting point of the solder balls 110, 118. The solder balls 110, 118 of the upper package 120 and the lower package 101 may be mated/joined together by the attachment process 119. During the attachment process 119, the metal formate 114 disposed on the surface of the TMI solder ball(s) 110 may be reduced to form H2 and CO2 at the temperature of the attachment process. The H2 gas 123 evolved from the metal formate reduction may then react with the metal oxide 125 disposed on the solder ball 118 of the upper package 120, and may remove the metal oxide from the upper package 120 solder balls 118.

In an embodiment, the metal formate 114 disposed on the lower package 101 solder balls 110 may be at least partially removed by decomposition at the attachment process temperature. In another embodiment, most if not all of the metal formate may be removed from the TMI solder ball 110. By removing the metal oxide 125 from the upper substrate 120 solder ball 118 during the attachment process 119, a superior solder joint formation between memory ball and TMI ball may be achieved.

Figure 1D:
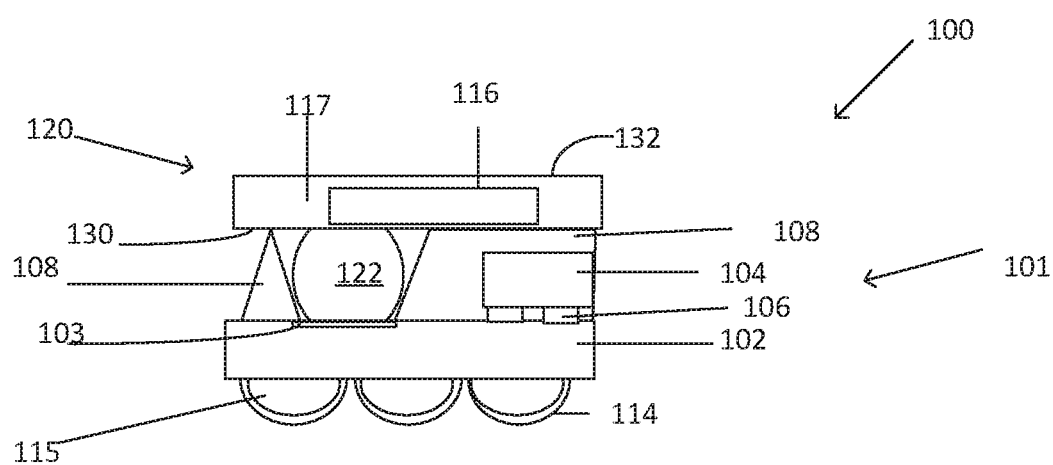

FIG. 1d (cross-sectional view), depicts a joint 122 that is formed by the reflow/attachment process 119 between the upper and lower solder balls 110, 118 of the upper and lower packages 120, 101. The package structure/assembly 100 thus formed may comprise a PoP assembly 100. The joint 122 between the two packages 101, 120 is not susceptible to solder bridging or solder open yield failures due to the clean, oxide free surfaces of the solder balls 110, 118 during the attachment process. In some embodiments, there may be residual metal formate that may be disposed within/on the joint 122, wherein the residual metal formate may be detectable with spectrographic and/or microscopic analysis techniques, such as thermal gravimetric analysis-fourier transform infrared spectroscopy (TGA-FTIR) and/or infrared reflection-absorption-spectroscopy (IR-RAS), time of flight-secondary ion mass spectroscopy (TOF-SIMS), visual inspection, gas chromatography, and/or mass spectrometry such as electro-spray-ionization mass-spectrometry (ESI-MS) for detection of metal formates both before and after the attachment process.

Figure 1E:
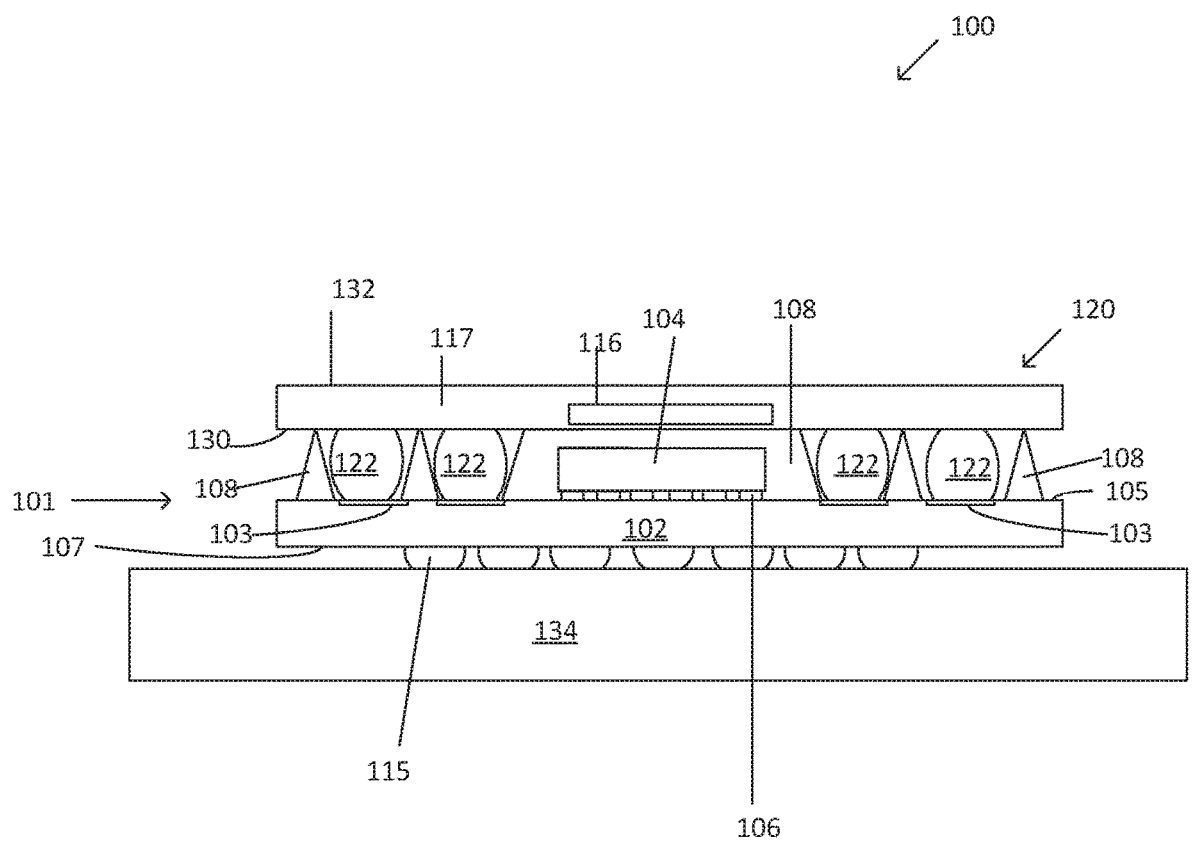

FIG. 1e depicts a cross sectional view of a PoP package/assembly 100 comprising joint structures 122 fabricated according to embodiments described herein. The PoP assembly 100 includes a lower IC package 101 and an upper IC package 120, wherein each of the lower and upper IC packages 101, 120 may include any suitable device/die or combination of devices. According to one embodiment, lower IC package 101 includes one or more processing systems and the upper IC package 120 includes one or more memory devices. In another embodiment, lower IC package 101 includes one or more processing systems and upper IC package 120 comprises a wireless communications system (or, alternatively, includes one or more components of a communications system).

In a further embodiment, the lower IC package 101 includes one or more processing systems and the upper IC package 120 includes a graphics processing system. The PoP assembly 100 may comprise part of any type of computing system, such as a hand-held computing system (e.g., a cell phone, smart phone, music player, etc.), mobile computing system (e.g., a laptop, nettop, tablet, etc.), a desktop computing system, or a server. In one embodiment, the PoP assembly 100 comprises a solid-state drive (SSD).

The lower IC package 101 may comprise any suitable package structure. In one embodiment, the lower IC package comprises an IC die 104 disposed on a substrate 102, and is electrically (and perhaps mechanically) coupled with the substrate 102 by a number of interconnects 106. In one embodiment, the die 104 is disposed on the substrate 102 in a flip-chip arrangement, and each of the interconnects 106 may comprise an electrically conductive terminal on the die 106 (e.g., a conductive pad, conductive bump, conductive pillar, or other structure or combination of structures) and a mating conductive terminal on the substrate 102 (e.g., a conductive pad, conductive bump, conductive pillar, or other structure or combination of structures) that are electrically coupled by, for example, a solder reflow process.

In another embodiment, the die 106 is electrically coupled with the substrate 102 by one or more wirebonds, and a layer of die attach adhesive disposed between the die and substrate may aid in mechanically securing the die to the substrate. In a further embodiment, two or more IC die (not shown) may be disposed on the substrate 102, and each of these die may be electrically coupled with the substrate 102 by the aforementioned flip-chip interconnects or by wirebonds, or by any suitable combination of these interconnect structures or other types of interconnects. In yet a further embodiment, one or more of the die may be stacked over one of the other IC die.

The upper IC package 120 may comprise a memory die disposed on a substrate. A plurality of interconnects/joints 122 electrically couple the upper IC package 120 with the lower IC package 101. Each of the joint structures 122 may comprise any type of structure and materials capable of providing electrical communication between the upper and lower IC packages 120, 101, and may be located in a peripheral portion of each of the respective substrates 117, 102. The joints 122 may or may not comprise metal formate residue on surfaces and/or within the joints 122. According to one embodiment, the joints 122 may comprise a reflowed solder bump extending between a terminal (e.g., a pad, bump, column, or pillar) on a first surface 105 of the lower package substrate 102 and a mating terminal (e.g., a pad, bump, column, or pillar) on a first surface 130 of the upper package substrate 117.

In one embodiment, the solder joints 122 also aid in mechanically securing the upper IC package 120 to the lower package 101. The joints 122 may or may not comprise residual metal formate material, such as tin formate, nickel formate or copper formate, for example, that may be detected using analysis techniques described herein. In other embodiments, the metal formate may be virtually undetectable. The PoP assembly 100 comprises joint structures 122 which exhibit strong joints that avoid solder bridging, solder opens, and other yield failures due to the utilization of the formate process of the embodiments herein.

An array of solder balls 115 may be disposed on a second side of the first substrate 102, and may comprise conductive materials, such as a solder material. In an embodiment, the materials may comprise tin-silver-copper (SAC) alloy material for example, and may further comprise a metal formate on the surface and/or within the solder ball 115 prior to assembly onto product circuit board (134). The package structure/assembly 100 may be attached to a board 134 utilizing any suitable attachment process. In an embodiment, the board 134 may comprise a motherboard, but may comprise any other type of substrate 134 that may be suitable for the particular application. In an embodiment, the array of solder balls 115 may or may not comprise a coating/residue of the metal formate between the surfaces of the solder balls 115 and conductive mating surfaces/terminals disposed on the board 134 after attachment.

The board 134 may comprise any suitable type of circuit board or other substrate capable of providing electrical communication between one or more of the various components disposed on the board. In one embodiment, for example, the board 134 may comprise a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 134. However, it should be understood that the disclosed embodiments are not limited to the above-described PCB and, further, that board 134 may comprise any other suitable substrate.

The various embodiments of the package assemblies/structures described herein enable outgoing lower package structures to comprise a built in activator layer to help enable wetting during a subsequent SMT process, which ensures yield requirements are met independent of process and materials used during a particular PoP attach process. The protective formate based coating for TMI solder balls enables a transparent PoP memory (such as a dynamic random access memory (DRAM)) SMT attach process for system on a chip packaging technology, for example. The use of the the formate process, enables the formation of reliable joints with no contact open failures.

The embodiments described herein provide for long shelf life of PoP packages that allows retention of solderability without or minimal use of the traditional soldering flux/paste that may be required in assembly of PoP packages. Cost is lowered and throughput improved by utilizing assembly process according to the methods of the embodiments described herein. The methods/structures herein may be used in mobile and tablet applications, OEM/ODM and/or IC assembly operations, and may be used for high warpage ball grid array (BGA) packages. Shelf life of package structures comprising the metal formate coating may increase up to about two years, and opens may be reduced during SMT processing. The use of rosin based pre-coats, which suffer from sticking of components at about 125 degrees, bridging, opens, and non-wets between balls, may be avoided.

Figure 2:
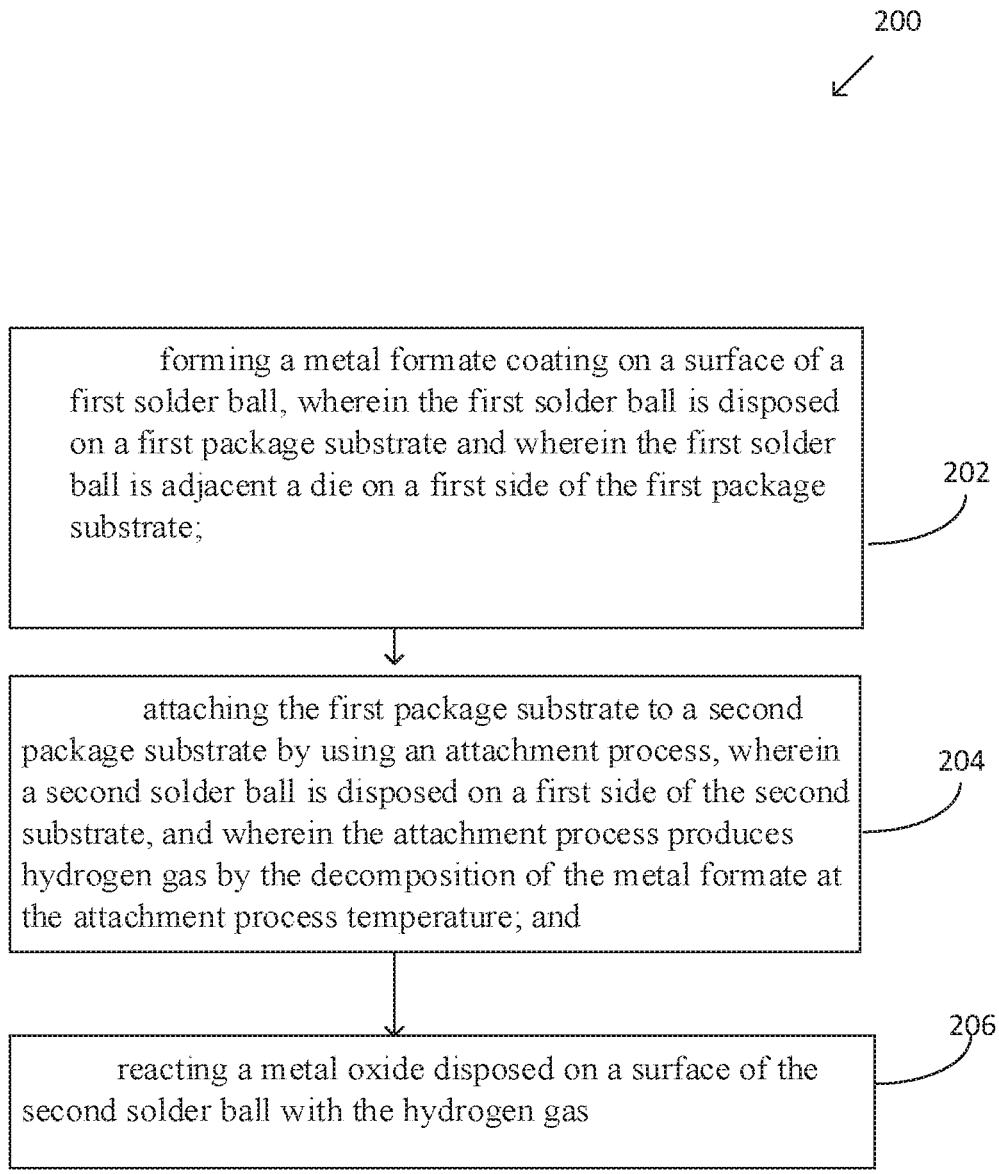
FIG. 2 represents a flow chart of a method according to embodiments.

FIG. 2 depicts a method 200 according to embodiments herein. At step 202, a metal formate coating may be formed on a surface of a first solder ball that is disposed on a first package substrate wherein the first solder ball is adjacent a die on a first side of the first package substrate. The metal formate may be formed by utilizing a formic acid vapor of at least 0.4 percent of total vapor concentration, for example. In some embodiments, the formic acid concentration may comprise greater than about 1.5 percent vapor concentration. The metal formate coating may additionally form on surfaces a plurality of solder balls disposed on a second side of the first substrate and/or on solder balls of a second package prior to attaching the second package to the first package. In an embodiment, the metal formate may be formed at a first temperature, wherein the first temperature may comprise between about 150 degrees and 200 degrees Celsius.

At step 204, the first package may be attached to a second package by using an attachment process, wherein a second solder ball is disposed on a first side of the second substrate, wherein the attachment process produces hydrogen gas by the decomposition of the metal formate at the attachment process temperature. The attachment temperature may comprise between about 200 degrees Celsius and about 260 degrees Celsius, in an embodiment. At step 206, a metal oxide disposed on a surface of the second solder ball may be reacted with the hydrogen gas. The hydrogen gas serves to remove the metal oxide, thus providing a clean surface with which to form the joint between the first solder ball and the second solder ball, In an embodiment, the second temperature may comprise a reflow temperature of the first and second solder balls.

The structures of the embodiments herein may be coupled with any suitable type of structures capable of providing electrical communications between a microelectronic device, such as a die, disposed in package structures, and a next-level component to which the package structures may be coupled (e.g., a circuit board). The device/package structures, and the components thereof, of the embodiments herein may comprise circuitry elements such as logic circuitry for use in a processor die, for example. Metallization layers and insulating material may be included in the structures herein, as well as conductive contacts/bumps that may couple metal layers/interconnects to external devices/layers.

In some embodiments the structures may further comprise a plurality of dies, which may be stacked upon one another, depending upon the particular embodiment. In an embodiment, the die(s) may be partially or fully embedded in a package structure.

The various embodiments of the device structures included herein may be used for system on a chip (SOC) products, and may find application in such devices as smart phones, notebooks, tablets, wearable devices and other electronic mobile devices. In various implementations, the package structures may be included in a laptop, a netbook, an ultrabook, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder, and wearable devices. In further implementations, the package devices herein may be included in any other electronic devices that process data.

Figure 3:
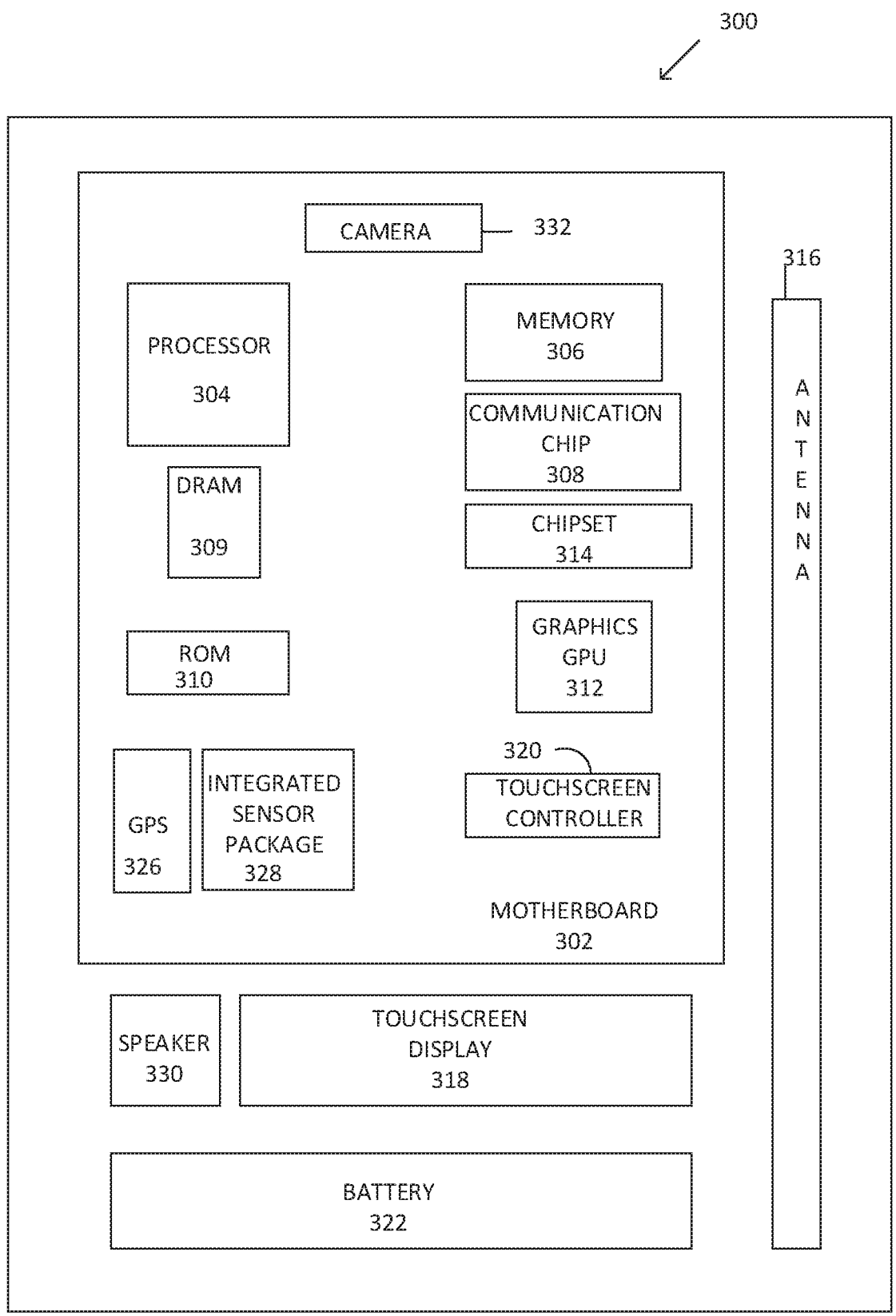
FIG. 3 represents a schematic of a computing device according to embodiments.

FIG. 3 is a schematic of a computing device 300 that may be implemented incorporating embodiments of the package structures described herein. For example, any suitable ones of the components of the computing device 300 may include, or be included in, package structures/assemblies, such as is depicted in FIG. 1e, wherein solder joints may or may not comprise a coating/reside of a metal formate after attachment process. Metal formate coating/layer can be easily detected on incoming packages solder balls prior to SMT assembly by methods described above. In an embodiment, the computing device 300 houses a board 302, such as a motherboard 302 for example. The board 302 may include a number of components, including but not limited to a processor 304, an on-die memory 306, and at least one communication chip 308. The processor 304 may be physically and electrically coupled to the board 302. In some implementations the at least one communication chip 308 may be physically and electrically coupled to the board 302. In further implementations, the communication chip 408 is part of the processor 304.

Depending on its applications, computing device 300 may include other components that may or may not be physically and electrically coupled to the board 302, and may or may not be communicatively coupled to each other. These other components include, but are not limited to, volatile memory (e.g., DRAM) 309, non-volatile memory (e.g., ROM) 310, flash memory (not shown), a graphics processor unit (GPU) 312, a chipset 314, an antenna 316, a display 318 such as a touchscreen display, a touchscreen controller 320, a battery 322, an audio codec (not shown), a video codec (not shown), a global positioning system (GPS) device 326, an integrated sensor 328, a speaker 330, a camera 332, compact disk (CD) (not shown), digital versatile disk (DVD) (not shown), and so forth). These components may be connected to the system board 302, mounted to the system board, or combined with any of the other components.

The communication chip 308 enables wireless and/or wired communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 308 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond.

The computing device 300 may include a plurality of communication chips 308. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 300 may be a laptop, a netbook, a notebook, an ultrabook, a smartphone, a tablet, a personal digital assistant (PDA), an ultra mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments of the package structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

EXAMPLES

Example 1 is a microelectronic package structure comprising a first package comprising a first substrate; a first die disposed on the first substrate; a first solder ball disposed on the first substrate adjacent the first die; a second package comprising a second substrate, wherein the second substrate comprises a first side and a second side; a second die disposed on the first side of the second substrate; and a second solder ball adjacent the second die; wherein at least one of a surface of the first solder ball or a surface of the second solder ball comprises a formate coating.

Example 2 includes the microelectronic package structure of example 1 wherein the microelectronic package structure comprises a package on package assembly.

Example 3 includes the microelectronic package structure of example 1 wherein the metal formate is selected from the group consisting of tin formate, copper formate, silver formate and nickel formate.

Example 4 includes the microelectronic package structure of example 1 wherein the metal formate comprises a thickness of about one monolayer to about 1 micrometer.

Example 5 includes the microelectronic package structure of example 1 wherein the second side of the second substrate comprises an array of solder balls, wherein surfaces of the array of solder balls include the metal formate.

Example 6 includes the microelectronic package structure of example 1 wherein the first solder ball is disposed adjacent sidewalls of a molding compound that is disposed between the first and second substrates.

Example 7 includes the microelectronic package structure of example 1 wherein the first die is a central processing unit, and the second die is a memory die.

Example 8 includes the microelectronic package structure of example 5 wherein the array of solder balls are disposed on a motherboard.

Example 9 is a method of forming a microelectronic package assembly comprising: forming a metal formate coating on a surface of a first solder ball, wherein the first solder ball is disposed on a first package substrate, and wherein the first solder ball is adjacent a die on a first side of the first package substrate; attaching the first package substrate to a second package substrate by using an attachment process, wherein a second solder ball is disposed on a first side of the second substrate, and wherein the attachment process produces hydrogen gas by the decomposition of the metal formate at the attachment process temperature; and reacting a metal oxide disposed on a surface of the second solder ball with the hydrogen gas.

Example 10 includes the method of forming the microelectronic package assembly of example 9 wherein the metal formate is selected from the group consisting of tin formate, copper formate, silver formate and nickel formate.

Example 11 includes the method of forming the microelectronic package assembly of example 9 wherein the attachment process temperature comprises between about 200 degrees Celsius to about 260 degrees Celsius.

Example 12 includes the method of forming the microelectronic package assembly of example 9 wherein forming the metal formate comprises exposing the first solder ball to a vapor concentration of greater than about 0.4 percent formic acid at a temperature of between about 150 degrees Celsius and about 200 degrees.

Example 13 includes the method of forming the microelectronic package assembly of example 9 wherein the first substrate comprises an array of solder balls on a second side of the first substrate, wherein forming the metal formate further comprises forming the metal formate on surfaces of the array of solder balls.

Example 14 includes the method of forming the microelectronic package assembly of example 9 wherein a surface of the second solder ball comprises a metal oxide, and further comprising removing the metal oxide from the second solder ball by reacting the hydrogen gas with the metal oxide.

Example 15 includes the microelectronic package assembly of example 9 wherein the second package comprises a memory package, and the first package comprises a microprocessor package.

Example 16 includes the method of forming the microelectronic package assembly of example 9, wherein the microelectronic assembly comprises a package on package assembly.

Example 17 is a method of forming a microelectronic package structure, comprising: forming a metal formate on a surface of a first solder interconnect structure disposed on a first package substrate at a first temperature; and attaching a second solder interconnect structure disposed on a second package substrate to the first solder interconnect structure at a second temperature, wherein the second temperature decomposes at least a portion of the metal formate and generates a hydrogen gas; and reacting a metal oxide disposed on the second solder interconnect structure with the hydrogen gas.

Example 18 includes the method of forming the microelectronic package structure of example 17 wherein the first temperature comprises between about 150 degrees and about 200 degrees Celsius, and wherein forming the metal formate comprises forming the metal formate at a formic acid vapor concentration of above about 0.4 percent.

Example 19 includes the method of forming the microelectronic package of example 17 wherein forming the metal formate comprises forming at least one of a tin formate, a nickel formate, a copper formate or a silver formate.

Example 20 includes the method of forming the microelectronic package structure of example 17, wherein reacting the metal oxide disposed on the second solder interconnect structure with the hydrogen gas comprises removing the metal oxide disposed on the second solder interconnect structure with the hydrogen gas.

Example 21 includes the method of forming a microelectronic package structure of example 17 wherein the first solder interconnect structure comprises a through mold interconnect structure.

Example 22 includes the method of forming the microelectronic package structure of example 17 further comprising wherein the second temperature comprises between about 200 degrees Celsius to about 260 degrees Celsius.

Example 23 includes the method of forming the microelectronic structure of example 17 wherein the second temperature comprises the temperature of a surface mount attach process.

Example 24 includes the method of forming the microelectronic package structure of example 17 further comprising forming a solder joint between the first solder interconnect structure and the second solder interconnect structure.

Example 25 includes the method of forming the microelectronic package structure of example 24 wherein the solder joint is disposed between the first and second package substrates, and wherein the package structure comprises a portion of a package on package assembly.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A microelectronic package structure comprising:
    a first package comprising a first substrate;
    a first die on the first substrate;
    a first solder ball on the first substrate adjacent the first die;
    a second package comprising a second substrate, wherein the second substrate comprises a first side and a second side;
    a second die on the first side of the second substrate; and
    a second solder ball adjacent the second die; wherein at least one of a surface of the first solder ball or a surface of the second solder ball comprises a metal formate coating, wherein the metal formate coating comprises a stoichiometry of about 1 part metal to about 2 parts formate.

2. The microelectronic package structure of claim 1, wherein the microelectronic package structure comprises a package on package assembly.

3. The microelectronic package structure of claim 1 wherein the metal formate comprises at least one of tin formate, copper formate, silver formate, or nickel formate.

4. The microelectronic package structure of claim 1 wherein the metal formate comprises a thickness of about a monolayer to about 1 micrometer.

5. The microelectronic package structure of claim 1 wherein the second side of the second substrate comprises an array of solder balls, wherein surface of the array of solder balls comprise the metal formate.

6. The microelectronic package structure of claim 5 wherein the array of solder balls are disposed on a motherboard.

7. The microelectronic package structure of claim 1 wherein the second solder ball is adjacent sidewalls of a molding compound that is disposed between the first and second substrates.

8. The microelectronic package structure of claim 1 wherein the first die is a central processing unit, and the second die is a memory die.

* * * * *